US009478389B2

(12) United States Patent
Nomaguchi et al.

(10) Patent No.: US 9,478,389 B2
(45) Date of Patent: Oct. 25, 2016

(54) SCANNING ELECTRON MICROSCOPE

(71) Applicant: Hitachi High-Technologies Corporation, Minato-ku, Tokyo (JP)

(72) Inventors: Tsunenori Nomaguchi, Tokyo (JP); Toshihide Agemura, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/422,374

(22) PCT Filed: Jul. 1, 2013

(86) PCT No.: PCT/JP2013/067965
§ 371 (c)(1),
(2) Date: Feb. 19, 2015

(87) PCT Pub. No.: WO2014/030433
PCT Pub. Date: Feb. 27, 2014

(65) Prior Publication Data
US 2015/0221468 A1    Aug. 6, 2015

(30) Foreign Application Priority Data

Aug. 22, 2012  (JP) ................. 2012-182833

(51) Int. Cl.
*H01J 37/10* (2006.01)
*H01J 37/28* (2006.01)
(Continued)

(52) U.S. Cl.
CPC ............ *H01J 37/10* (2013.01); *H01J 37/1413* (2013.01); *H01J 37/1471* (2013.01); *H01J 37/16* (2013.01);
(Continued)

(58) Field of Classification Search
USPC ....................................................... 250/491.1
See application file for complete search history.

(56) References Cited

U.S. PATENT DOCUMENTS 4,219,732 A * 8/1980 Nakagawa ............ H01J 37/141
250/311
4,831,267 A * 5/1989 Brunner .................... G01T 1/28
250/305

(Continued)

FOREIGN PATENT DOCUMENTS

JP    57-118356 A    7/1982
JP    2004-14229 A   1/2004

(Continued)

OTHER PUBLICATIONS

International Search Report (PCT/ISA/210) dated Aug. 13, 2013, with English translation (Ten (10) pages).

*Primary Examiner* — Phillip A Johnston
(74) *Attorney, Agent, or Firm* — Crowell & Moring LLP

(57) ABSTRACT

The present invention provides a composite charged particle beam device which is provided with two or more charged particle beam columns and enables high-resolution observation while a sample is placed at the position of a cross point. The present invention has the following configuration. A composite charged particle beam device is provided with a plurality of charged particle beam columns (101a, 102a), and is characterized in that a sample (103) is disposed at the position of an intersection point (171) where the optical axes of the plurality of columns intersect, a component (408a, 408b) that forms the tip of an objective lens of the charged particle beam column (102a) is detachable, and by replacing the component (408a, 408b), the distance between the intersection point (171) and the tip of the charge particle beam column can be changed.

7 Claims, 10 Drawing Sheets

(51) Int. Cl.
*H01J 37/147* (2006.01)
*H01J 37/22* (2006.01)
*H01J 37/305* (2006.01)
*H01J 37/317* (2006.01)
*H01J 37/26* (2006.01)
*H01J 37/141* (2006.01)
*H01J 37/16* (2006.01)
*H01J 37/30* (2006.01)

(52) U.S. Cl.
CPC ............ *H01J 37/222* (2013.01); *H01J 37/261* (2013.01); *H01J 37/265* (2013.01); *H01J 37/28* (2013.01); *H01J 37/305* (2013.01); *H01J 37/3005* (2013.01); *H01J 37/3056* (2013.01); *H01J 37/3178* (2013.01); *H01J 2237/0245* (2013.01); *H01J 2237/032* (2013.01); *H01J 2237/12* (2013.01); *H01J 2237/31745* (2013.01)

(56) References Cited

U.S. PATENT DOCUMENTS

| | | | |
|---|---|---|---|
| 7,221,731 B2* | 5/2007 | Yada | G21K 7/00 250/396 ML |
| 8,247,782 B2* | 8/2012 | Edinger | C23F 4/00 250/306 |
| 2005/0285037 A1 | 12/2005 | Nakamura et al. | |
| 2006/0076489 A1 | 4/2006 | Ohshima et al. | |

FOREIGN PATENT DOCUMENTS

| | | |
|---|---|---|
| JP | 2006-12583 A | 1/2006 |
| JP | 2006-114225 A | 4/2006 |
| JP | 2008-123891 A | 5/2008 |
| JP | 2010-157370 A | 7/2010 |
| JP | 2011-222525 A | 11/2011 |
| JP | 2011-258451 A | 12/2011 |

* cited by examiner

SCANNING ELECTRON MICROSCOPE

TECHNICAL FIELD

The present invention relates to a scanning electron microscope.

BACKGROUND ART

A composite charged particle beam device, which is provided with both a scanning electron microscope (SEM) and a focused ion beam (FIB), has a feature that a region which is processed (or being processed) using a focused ion beam can be observed in situ with a SEM at high resolution. Therefore, it is an essential tool in manufacturing samples for transmission electron microscope observation and also in various industrial fields, such as the field of semiconductor, the field of material sciences, and the field of medicine where nanometer-order micro-processing is required.

Cited literature 1 discloses an objective lens for an electron microscope system having a minimum magnetic field outside the objective lens.

CITATION LIST

Patent Literature

Patent Literature 1: JP-A-2011-222525

SUMMARY OF INVENTION

Technical Problem

The inventors have made intensive studies on a composite charged particle beam device and acquired the following knowledge.

A device provided with only one charged particle beam column such as, for example, a SEM may have a sample positioned on the optical axis of the SEM. Therefore, the distance between the sample and the charged particle beam column can be changed appropriately according to application. For example, when high-resolution observation is desired, observation is performed with a sample positioned closer to a charged particle beam column.

On the other hand, in the case of a device provided with two or more charged particle beam columns such as, for example, a device provided with a SEM and a FIB, a position where SEM observation and FIB processing can be performed without moving a sample is limited to only a single point (a cross point) where the optical axis of the SEM and the optical axis of the FIB intersect. Therefore, it is typical to use a FIB-SEM device at a cross point, and the distance between the sample and the end of each charged particle beam column is fixed.

The device provided with two or more charged particle beam columns can also have a sample disposed at a position other than the cross point, but in such a case only one of the charged particle beam columns is used. For example, where a FIB-SEM device has a sample approached to a SEM column, usage is limited to the SEM only. To perform processing with the FIB, it is necessary to move the sample to the cross point again.

Also, a material of a component which exists near the sample has great influences on the composition analysis of the sample. For example, if the same substance as an element to be detected is used for the component of the tip of the objective lens when X-ray analysis is performed, it cannot be distinguished whether it is a signal from the sample or a signal from the tip of the objective lens. As countermeasures, there is a method such as applying plating of a material not containing the element to be analyzed to the tip of the objective lens. But, when samples to be analyzed widely vary, it becomes difficult to cope with by plating.

Solution to Problem

The present invention pertains to a scanning electron microscope, including: an electron beam column, which includes a tip of an objective lens of the electron beam column configured with a detachable component so that a tip of an objective lens made of a different material can be attached thereto.

Other embodiments are described in the column of DESCRIPTION OF EMBODIMENTS.

Advantageous Effects of Invention

According to the present invention, system peak can be handled by preparing plural tips of different materials of objective lens.

DESCRIPTION OF EMBODIMENTS

Figure 1:
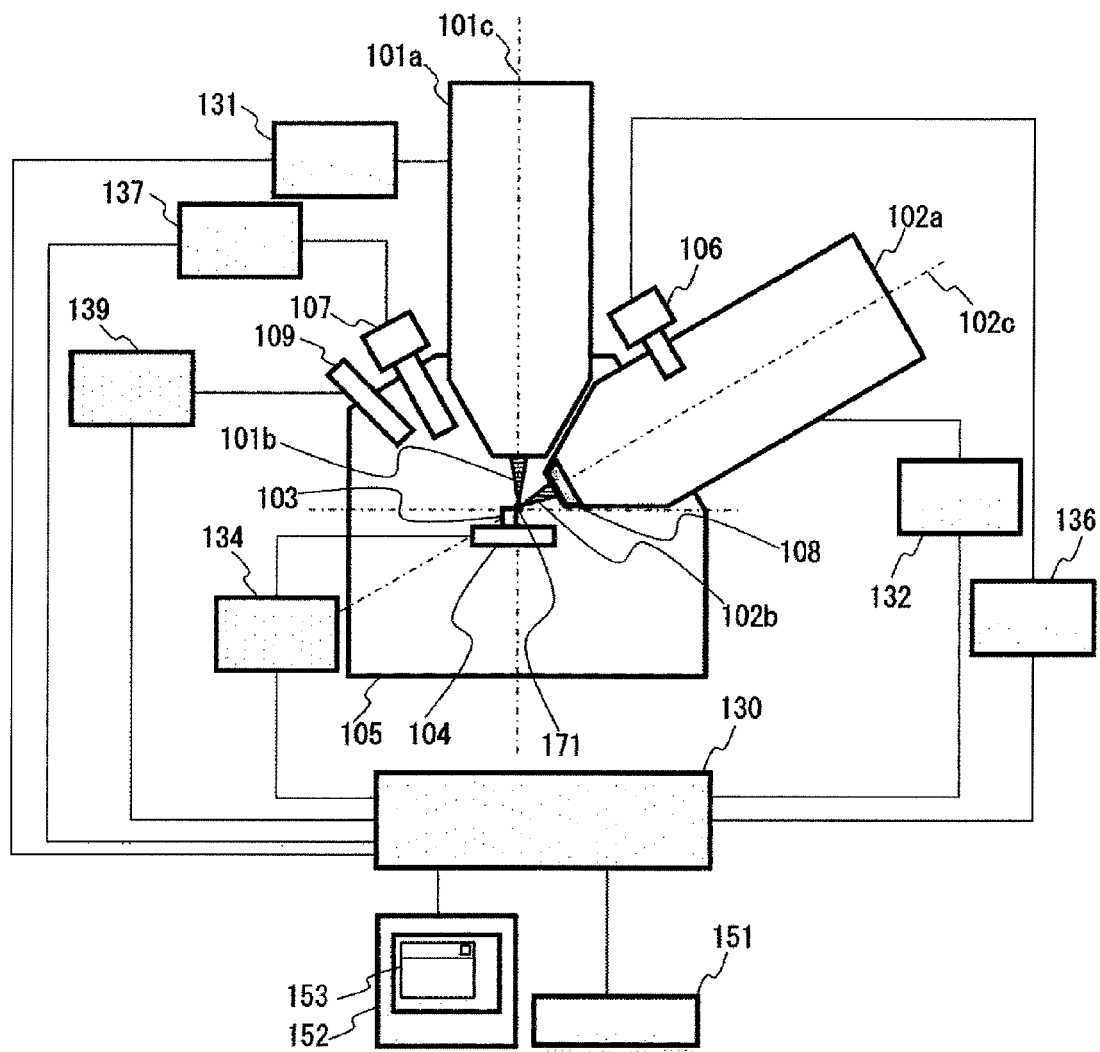
FIG. 1 shows a schematic diagram of a first embodiment.

Novel features and effects of the present invention are described by considering the drawings. In the individual drawings, the same reference numerals are given to common constituents.

Embodiment 1

[Construction of Composite Charged Particle Beam Device]

Figure 2:
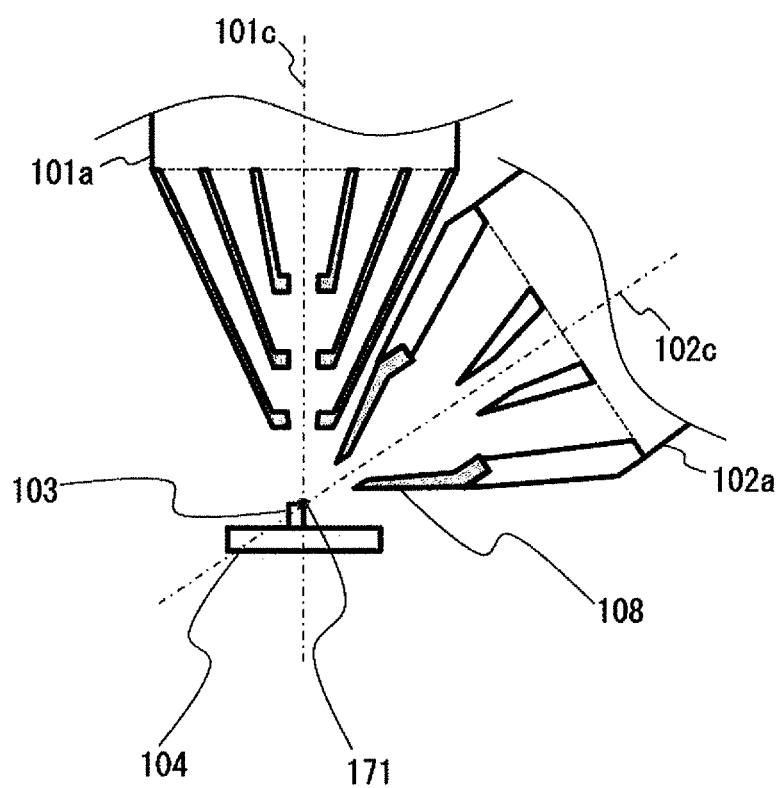
FIG. 2 shows a magnified view of the vicinity of a cross point.

First, a device construction in the present embodiment is described. FIG. 1 shows a schematic diagram of a composite charged particle beam device of the present embodiment. FIG. 2 shows a magnified view of the vicinity of a cross point.

In FIG. 1, the composite charged particle beam device is provided with an ion beam column 101a, an ion beam column controller 131 for controlling the ion beam column 101a, an electron beam column 102a, an electron beam column controller 132 for controlling the electron beam column 102a, a sample stage 104 on which a sample 103 can be mounted, a sample stage controller 134, a sample chamber 105, detectors 106, 107 for detecting electrons generated when the sample 103 is irradiated by an electron beam 102b or an ion beam 101b, detector controllers 136, 137 which control the respective detectors, an X-ray detector 109, an X-ray detector controller 139 which controls the X-ray detector, an integrated computer 130 which controls operations of the entire composite charged particle beam device, a controller (such as a keyboard or a mouse) 151 with which an operator inputs various instructions such as irradiation conditions and a position of the sample stage, and one or a plurality of displays 152 which display a GUI screen 153 for controlling the device, a status of the device, acquired information (including an image), and the like. The status of the device, the acquired information, and the like may be included in the GUI screen 153.

The ion beam column 101a is a system including all necessary constituents for a FIB such as an ion source for generating the ion beam, a lens for focusing the ion beam, and a deflection system for scanning and shifting the ion beam. Similarly, the electron beam column 102a is a system including all necessary constituents for a SEM such as an electron source for generating the electron beam, a lens for focusing the electron beam, and a deflection system for scanning and shifting the electron beam. Moreover, a tip of an objective lens of the electron beam column 102a is configured with a detachable component 108.

And, the ion beam column 101a and the electron beam column 102a are mounted on the sample chamber 105, and the ion beam 101b travelling through the ion beam column 101a and the electron beam 102b travelling through the electron beam column 102a are primarily focused on an intersection (a cross point 171) of an optical axis 101c of the ion beam column and an optical axis 102c of the electron beam column. Besides, as for the ion beam 101b, gallium ions are generally used, but ion species do not matter for the purpose of processing the sample. Furthermore, the ion beam is not limited to a focused ion beam and may be a broad ion beam.

Incidentally, in the present embodiment, the ion beam column 101a is vertically arranged and the electron beam column 102a is obliquely arranged; however, they are not restrictive and the ion beam column 101a may be obliquely arranged and the electron beam column 102a may be vertically arranged. Both the ion beam column 101a and the electron beam column 102a may also be obliquely arranged. Moreover, there may be adopted a triple-column configuration having a Ga focused ion beam column, an Ar focused ion beam column, and an electron beam column.

The sample stage 104 can make planar movement and rotational movement. Furthermore, a position necessary for processing with the ion beam or observation can also be moved to an ion beam irradiation position or to an observation position with the electron beam.

The component 108 which forms the tip of the objective lens desirably has an overall length of 35 mm or less considering the electron beam column 102a, the ion beam column 101a, and the sample stage 104.

The detectors 106, 107 are respectively mounted on the electron beam column 102a and the sample chamber 105. Moreover, each of the detector controllers 136, 137 has a circuit or an arithmetic processing unit to perform arithmetic processing of a detection signal and to form an image. It is noted that, for the detectors 106, 107, composite charged particle detectors capable of detecting ions in addition to electrons may be used. Also, in addition to the detector 107, the sample chamber 105 may be equipped with detectors such as a tertiary electron detector, a STEM detector, a backscattered electron detector, and a low energy loss electron detector as second, third, fourth, and fifth detectors. Furthermore, a mass spectrometer or the like may be mounted in addition to the X-ray detector 109.

In addition to the above, the sample chamber 105 is also equipped with a gas deposition unit, a micro sampling unit, and the like. The individual drive mechanisms such as the deposition unit and the micro sampling unit are also provided with controllers respectively. The gas deposition unit used for manufacturing of a protective film and/or for marking stores a deposition gas which forms a deposit film by irradiation of a charged particle beam and can supply it from a tip of a nozzle when necessary. The micro sampling unit that picks up a specific portion of a sample while being used together with processing and cutting of the sample with the FIB includes a probe which can be moved by a probe driving unit within the sample chamber 105. The probe is used to remove a minute sample piece which is formed in the sample and/or to supply an electric potential to the sample by contacting to the sample surface. In addition, the sample chamber 105 may also be equipped with a cold trap, an optical microscope, and the like. Incidentally, as for the sample 103, steel, light metals, and polymer-based macromolecule substances may also be conceived other than a semiconductor sample. Besides, the integrated computer 130 and the respective controllers can communicate with each other.

[Fixing Method of Tip of Objective Lens]

Fixing methods of the component 108 of the tip of the objective lens are variously considered, such as a fixing method with a screw, a method that the component itself is threaded, and a fixing method by compression bonding. Their examples are described below.

Figure 3:
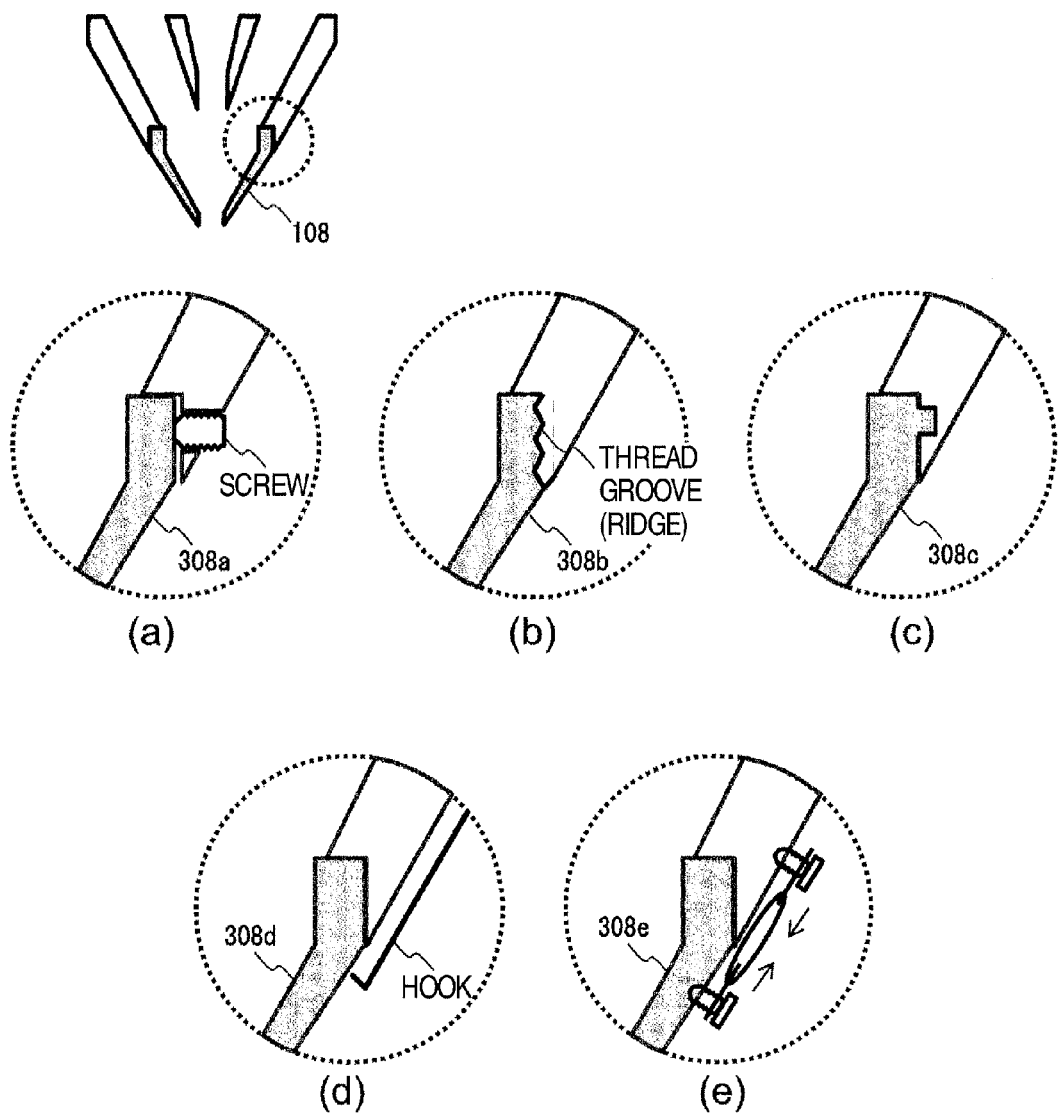
FIG. 3 shows examples of fixing a component of the tip of an objective lens.

FIG. 3(a) shows a fixing example with a screw. Fixing can be made using one screw, but using two or more screws is desirable in view of stability. In addition, fixing using three to four screws is desirable when adjustment of the component position during assembly is considered. It is because use of three to four screws provides an advantage that the position of a component 308a can be adjusted according to tightening degrees of the mutual screws.

FIG. 3(b) shows an example that a component 308b itself is threaded. It is advantageous that the number of components does not increase by fixing.

FIG. 3(c) shows an example of fixing by matching a groove and a projection. In FIG. 3(c), a component 308c has a projection, and the objective lens body has a groove, but the vice versa is also possible. Thus, they can be attached and detached more easily.

In addition to the above, there may be conceived various methods such as a method of fixing by catching a component 308d (FIG. 3(d)), a method of pulling up a component 308e (FIG. 3(e)), and a fixing method using a detachable adhesive material. Also, a plurality of methods may be combined in order to fix the component 108.

Effects of constructing the tip of the objective lens of the electron beam column 102a with the detachable component 108 are described.

By constructing the tip of the objective lens with a detachable component, the tip of the objective lens having a different structure can be attached according to usage. As a result, there can be attained effects, for example, (1) being capable of changing the distance (Working Distance: WD) between the sample and the lower surface of the objective lens, (2) facilitating repair when the tip of the objective lens is damaged or contaminated, and (3) being capable of coping with a system peak by preparing a plurality of tips of the objective lens of different materials. The individual effects are described below in detail.

[(1) Effects Regarding Capability of Changing WD]

Figure 4:
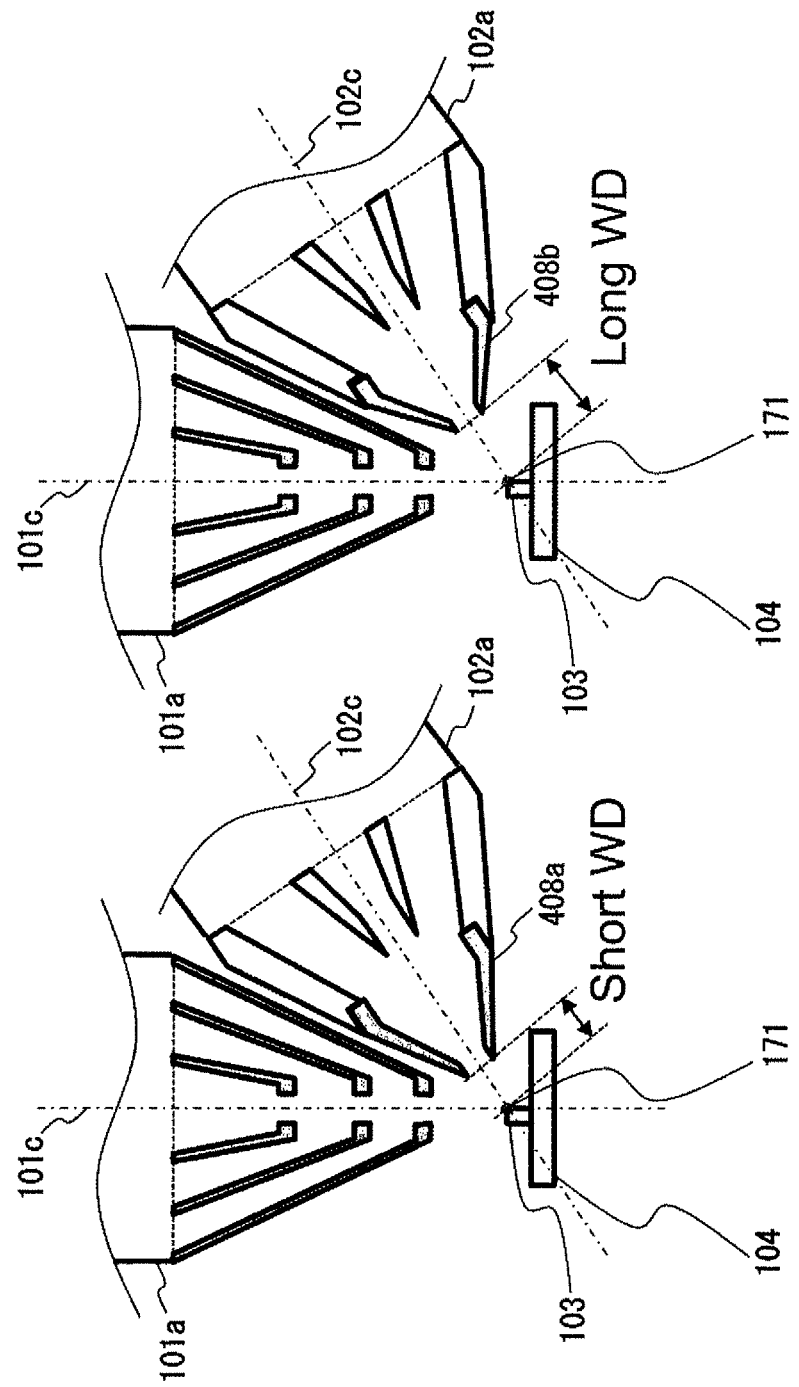
FIG. 4 shows an example that different components are attached to the tip of the objective lens.

Generally, resolution of the SEM is improved when the WD is shortened. On the other hand, when the WD is shorted, detection efficiency of the detector 107 and/or the X-ray detector 109 which are mounted on the sample chamber lowers. Therefore, it is desired that the WD is changed according to usage. A general-purpose SEM device which is equipped with a single charged particle beam column can comply with it by moving the sample stage, and it is carried out on a daily basis. But, for a FIB-SEM device, which is equipped with two or more charged particle beam columns, the sample stage 104 is adjusted to position the sample 103 at the cross point 171. Therefore, the position of the sample stage 104 in the optical axis direction is basically fixed. Namely, the WD is basically determined according to mounting positions of the ion beam column and the electron beam column. However, the WD can be changed by constructing the tip of the objective lens of the electron beam column 102a with the detachable component 108. That is, the WD is changed by changing the lower surface of the objective lens without moving the position of the sample stage 104. For example, as shown in FIG. 4, when high-resolution observation becomes significant, a component 408a for the tip of the objective lens is made long and, when a priority is desired to be given to the driving range of the sample stage or the detection efficiency of the detector 107 and/or the X-ray detector 109 than to the resolution, a component 408b for the tip of the objective lens may be made short.

Furthermore, when the component 408b for the tip of the objective lens is made short, the driving ranges of the deposition unit and the micro sampling unit can also be increased. In addition, the cold trap and the like can also be made closer to the sample. Namely, the versatility of the composite charged particle beam device can be improved.

Figure 5:
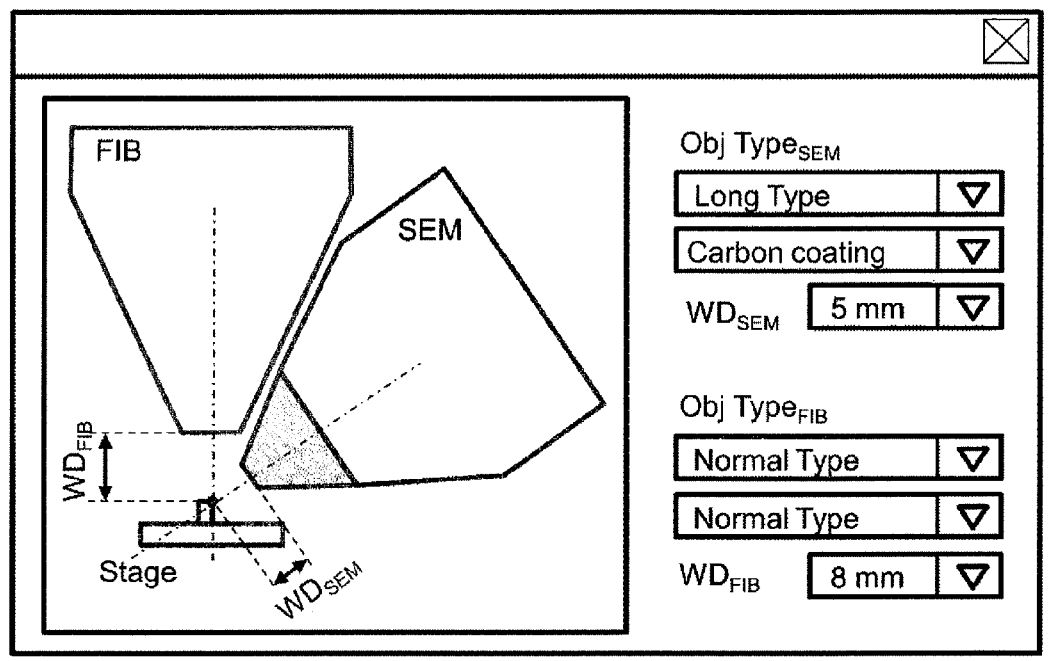
FIG. 5 shows an example of a GUI screen clearly indicating a type of a component of the tip of the objective lens.

In addition, it is convenient if the display of the GUI screen 153 is changed for each position of the tip of the objective lens. It is convenient if there are functions, for example, to clearly indicate types of attached objective lenses (FIG. 5), to clearly indicate the distance between the cross point and the end of each charged particle beam column (FIG. 5), and/or to clearly indicate the driving range of each unit for every type of objective lenses (FIG. 5). Incidentally, the methods of indication may be displays with letters and/or numerical values or diagrams such as figures and/or colors. Both of them may also be displayed.

[(2) Regarding Easiness of Repair in Case of Damage or Contamination of Tip of Objective Lens]

A gas discharged from the sample, sputtered particles due to ion beam, and the like adhere to a component near the sample. The performance of the charged particle beam device is occasionally deteriorated by the adhered substance. For example, there might be occurrence of bending of a primary beam or bending of electrons discharged from the sample due to an insulating material adhered to the tip of the objective lens. In such a case, works such as cleaning of the objective lens and, additionally, an exchange of a set of objective lenses become necessary. Moreover, the cleaning works have risk that the objective lens may be damaged during the works.

However, by constructing the tip of the objective lens of the electron beam column 102a with the detachable component 108, a measure of replacement can be taken against contamination and/or damage of the tip of the objective lens. Thus, much easier repair against contamination and/or damage of the tip of the objective lens with lower risk than before becomes possible.

[(3) Regarding Effects of being Capable of Corresponding to System Peak by Preparing Plural Tips of Different Materials of Objective Lens]

A material of a component which exists near the sample has great influences on the composition analysis of the sample. For example, if the same substance as an element to be detected is used for the component 108 of the tip of the objective lens when X-ray analysis is performed, it cannot be distinguished whether it is a signal from the sample or a signal from the tip of the objective lens. As countermeasures, there is a method such as applying plating of a material not containing the element to be analyzed to the tip of the objective lens. But, when samples to be analyzed widely vary, it becomes difficult to cope with by plating.

However, the components of the tip of the objective lens which are plated with different types of plating can be prepared by constructing the tip of the objective lens of the electron beam column 102a with the detachable component 108. Namely, it becomes possible to exchange the component of the tip of the objective lens according to an analysis object. Thus, a range of element analysis can be drastically improved.

Besides, it is convenient if the display of the GUI screen 153 is changed for every attached component of the tip of the objective lens (FIG. 5). Incidentally, the methods of indication may be displays with letters and/or numerical values or by a diagram. Both of them may also be shown. In FIG. 5, for example, "Obj Type$_{SEM}$" means information about the electron beam column 102a, "Long Type" means a long component, and "Carbon coating" means a component which is coated with carbon. "WD$_{SEM}$" shows a working distance from the sample to the tip of the column. Information about the ion beam column 101a at "Obj Type$_{FIB}$" is also the same.

Figure 6:
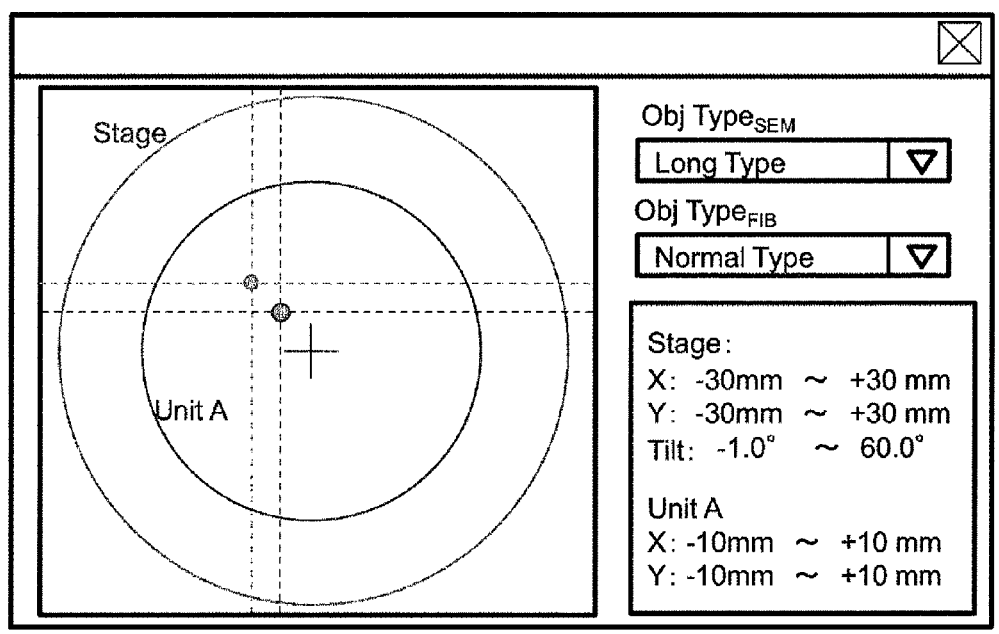
FIG. 6 shows an example of a GUI screen clearly indicating a movable range of each unit.
Figure 7:
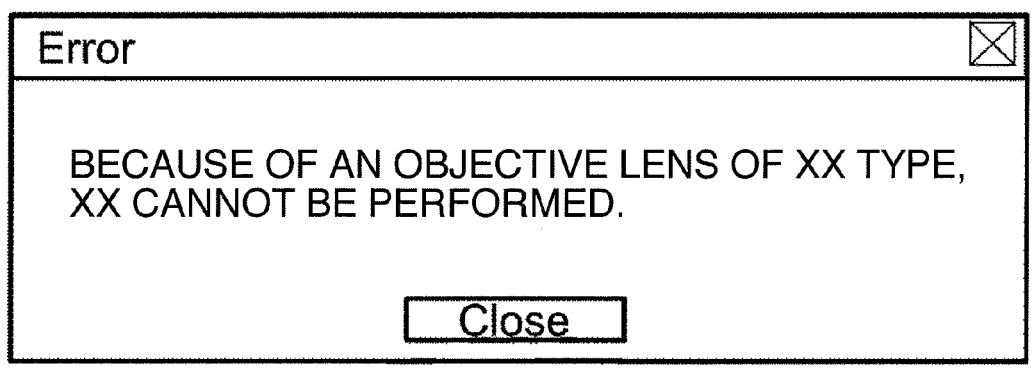
FIG. 7 shows an example of a warning or error screen.
Figure 7:
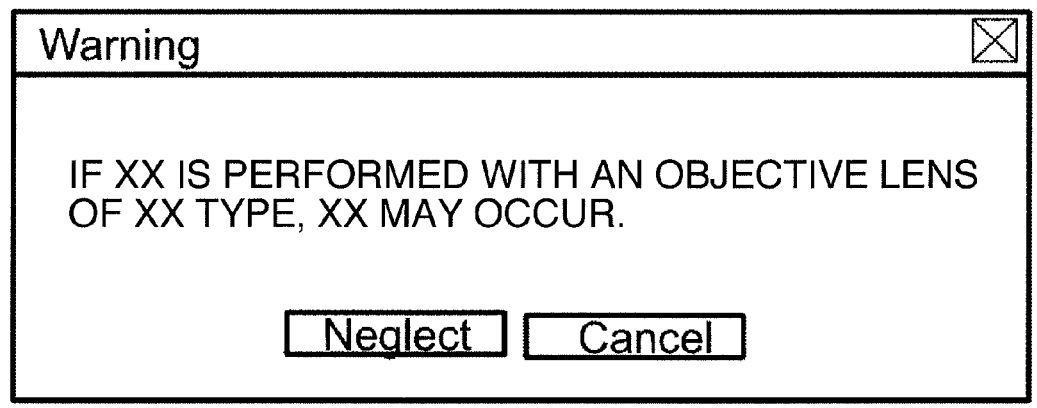

FIG. 6 shows an example of the GUI screen clearly indicating a movable range of each unit. In this GUI, the movable range of the stage and the movable range of Unit A (for example, a deposition unit, a micro sampling probe, or the like) are shown with numerical values.

Figure 8:
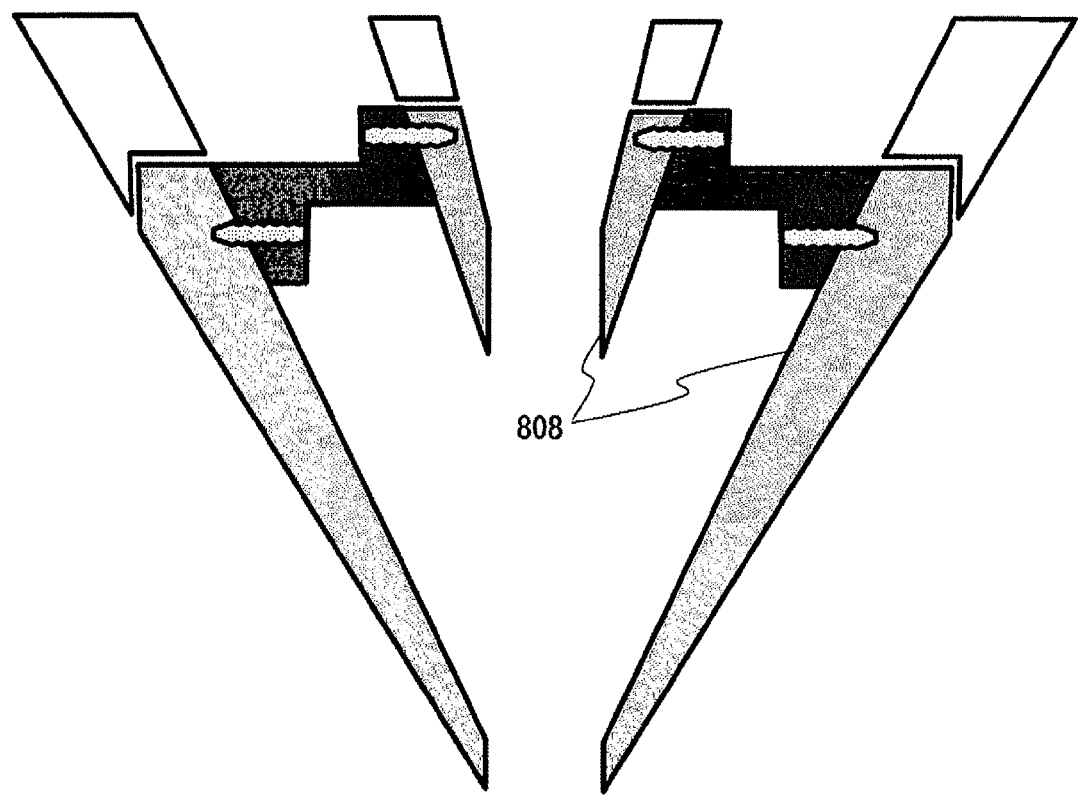
FIG. 8 shows an example where the component of the tip of the objective lens is an assembly.

Incidentally, although the objective lens on the SEM side is described in this embodiment, it is also the same on the FIB side. Furthermore, the component which forms the tip of the objective lens may be a unit which is constructed from a plurality of parts (FIG. 8) or may be divided into a plurality of parts (or units).

In addition, although a composite charged particle beam device provided with an ion beam column and an electron beam column is described in this embodiment, combinations of charged particle beam columns do not matter. For example, it may be applied to a device provided with two or more electron beam columns or a device provided with two or more ion beam columns. It may also be applied to a combination of a charged particle beam column and an optical device such as a laser.

Embodiment 2

Figure 9:
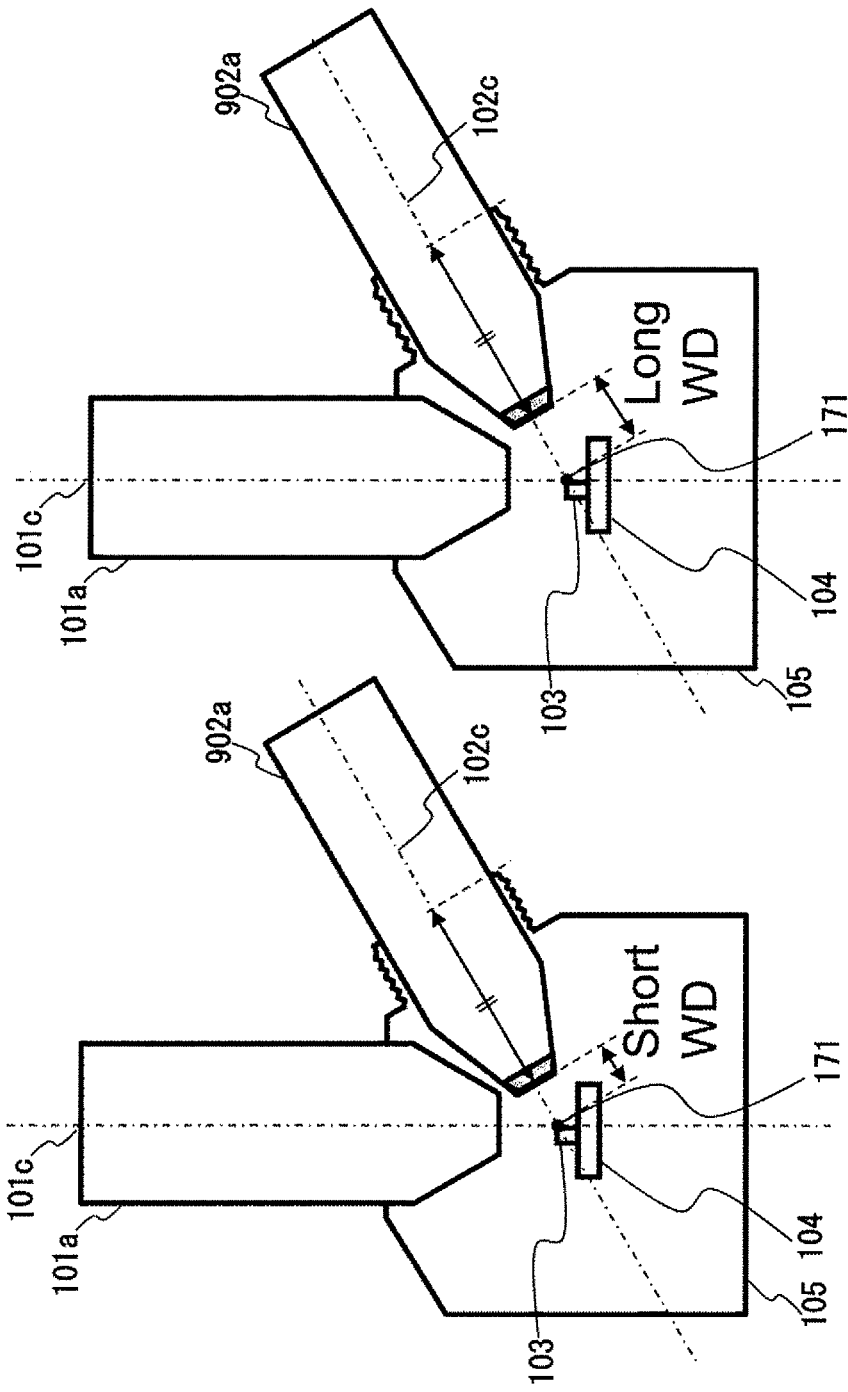
FIG. 9 shows a schematic diagram of a second embodiment.

FIG. 9 shows a structure of a composite charged particle beam device of a second embodiment. The structure of the composite charged particle beam device of the second embodiment is different from the device structure of the first embodiment in that a driving mechanism which drives an entire electron beam column is provided instead of the tip of the objective lens of an electron beam column 902a being detachable. The rest is almost the same as the device structure of the first embodiment. This driving mechanism can drive the entire electron beam column while the vacuum of the sample chamber is maintained.

According to the present embodiment, similar effects to "Effects regarding capability of changing WD" described for the first embodiment can be obtained. In addition, the present embodiment has an advantage that the WD can be changed while performing the SEM observation or during the FIB processing. Furthermore, it is also convenient in this embodiment if the display of the GUI screen is changed for each position of the tip of the objective lens, similar to the first embodiment.

Incidentally, even though a mechanism which drives the entire electron beam column is adopted in the present embodiment, only the objective lens may be driven in order to change the position of the tip of the objective lens; a part of the objective lens or a part of the column which includes the objective lens may be driven, either.

Moreover, a combination of the charged particle beam columns does not matter even in this embodiment, similar to the first embodiment.

Embodiment 3

Figure 10:
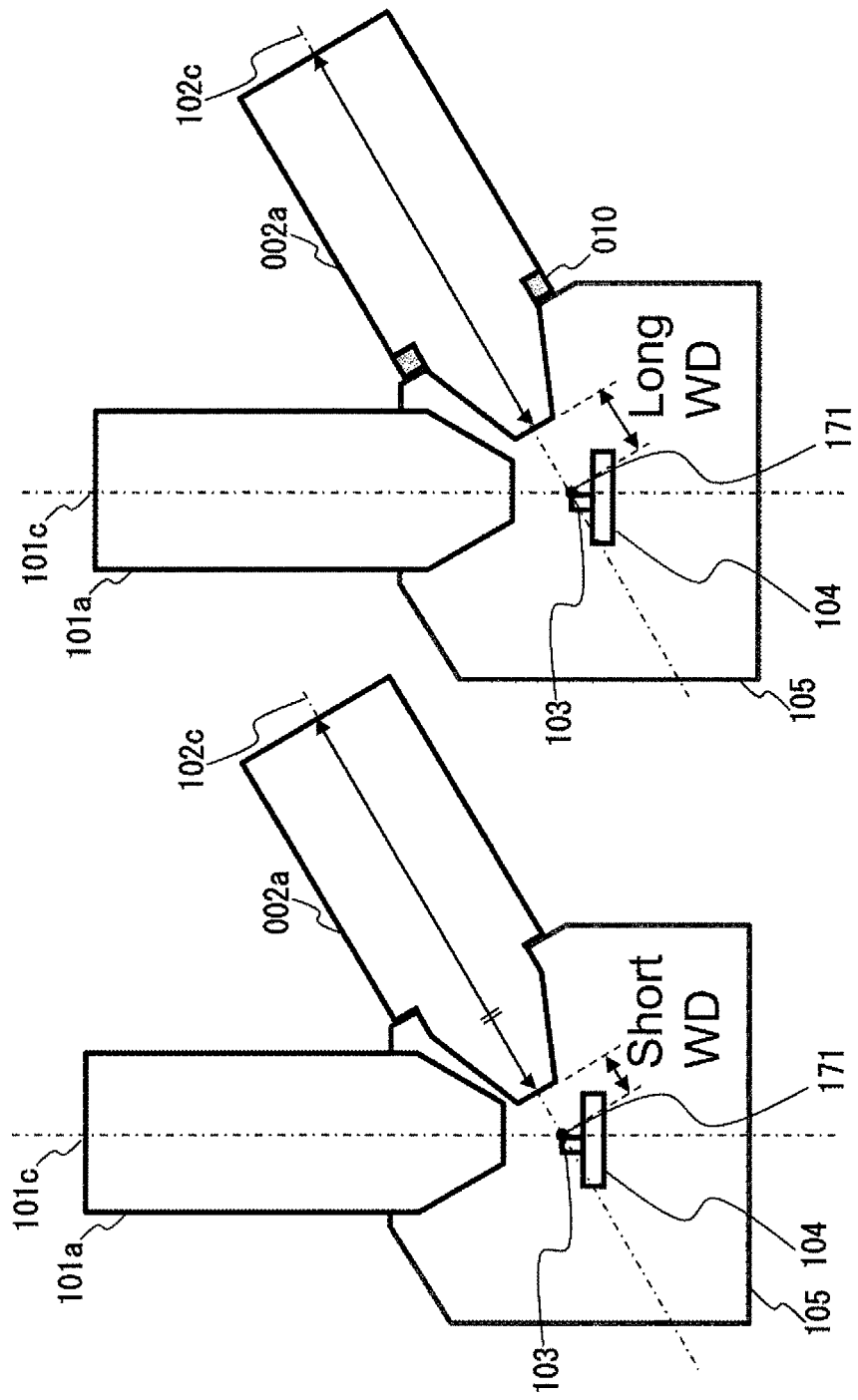
FIG. 10 shows a schematic diagram of a third embodiment.

FIG. 10 shows a structure of a composite charged particle beam device of a third embodiment. The structure of the composite charged particle beam device of the third embodiment is different from the device structure of the first embodiment in that it has a mechanism in which a flange 010 of a different size is provided between the objective lens and the sample chamber instead of the tip of the objective lens of an electron beam column 002a being detachable. The rest is almost the same as the device structure of the first embodiment. According to the present embodiment, similar effects to "Effects regarding capability of changing WD" described for the first embodiment can be obtained. Moreover, it is also convenient in this embodiment if the display of the GUI screen is changed for each position of the tip of the objective lens, similar to the first embodiment.

Furthermore, a combination of the charged particle beam columns does not matter even in this embodiment, similar to the first embodiment.

According to the present invention, in a composite charged particle beam device having two or more charged particle beam columns, which is represented by a FIB-SEM device, a shape of the tip of the objective lens can be changed according to application. As a result, a range of sample selections which a single composite charged particle beam device can deal with is expanded. Namely, the convenience of the device is drastically improved.

REFERENCE SIGNS LIST

101a: Ion beam column
101b: Ion beam
101c: Optical axis of ion beam column
102a, 902a, 002a: Electron beam column
102b: Electron beam
102c: Optical axis of electron beam column
103: Sample
104: Sample stage
105: Sample chamber
106, 107: Detector
108, 308a, 308b, 308c, 308d, 308e, 408a, 408b, 808: Detachable component
109: X-ray detector
130: Integrated computer
131: Ion beam column controller
132: Electron beam column controller
134: Sample stage controller
136, 137: Detector controller
139: X-ray detector controller
151: Controller (such as keyboard or mouse)
152: Display
153: GUI screen
171: Cross point
010: Flange

The invention claimed is:

1. A scanning electron microscope, comprising:
   an electron beam column including an objective lens;
   wherein the objective lens includes a body and a detachable component that forms a tip.

2. The scanning electron microscope according to claim 1, wherein the tip of the objective lens is formed of one of a plurality of types of the detachable component that are attachable to the body, and each of the types is made of a different material plated on the component.

3. The scanning electron microscope according to claim 1, wherein the tip of the objective lens is exchangeable depending on an analysis object.

4. The scanning electron microscope according to claim 1, further comprising an X-ray detector.

5. The scanning electron microscope according to claim 1, further comprising a display device for displaying a GUI for operating the scanning electron microscope, the display device being able to display a plurality of types of the component of the objective lens.

6. The scanning electron microscope according to claim 1, further comprising a display device for displaying a GUI for operating the scanning electron microscope, the display device being able to display a warning that a type of the component is inappropriate.

7. The scanning electron microscope according to claim 1, wherein the body of the objective lens is configured to be attachable to a plurality of types of the component, and each of the types is made of a different material.

* * * * *